United States Patent
Mallon et al.

(10) Patent No.: US 6,936,115 B2
(45) Date of Patent: Aug. 30, 2005

(54) SOLDERING FLUX VEHICLE ADDITIVE AND FINE PITCH PRINTING METHOD

(75) Inventors: Deborah Mallon, London (GB); Andrew David Price, Surrey (GB); Leela Josephine Sequeira, Croydon (GB); Robert Derek Williams, Croydon (GB)

(73) Assignee: Fry's Metals, Inc., Jersey City, NJ (US)

( * ) Notice: Subject to any disclaimer, the term of this patent is extended or adjusted under 35 U.S.C. 154(b) by 7 days.

(21) Appl. No.: 10/036,952

(22) Filed: Dec. 21, 2001

(65) Prior Publication Data

US 2002/0187264 A1 Dec. 12, 2002

(30) Foreign Application Priority Data

Jun. 7, 2001 (GB) .............................. 0113897
Jun. 7, 2001 (GB) .............................. 0113898

(51) Int. Cl.$^7$ .......................................... B23K 35/365
(52) U.S. Cl. .......................................... 148/23; 148/24
(58) Field of Search ..................... 148/23, 24

(56) References Cited

U.S. PATENT DOCUMENTS

| | | | | |
|---|---|---|---|---|
| 3,915,729 A | * | 10/1975 | Eustice ....................... | 106/268 |
| 5,120,371 A | * | 6/1992 | Bolden et al. ................ | 134/40 |
| 5,271,861 A | * | 12/1993 | Buchwald et al. ........... | 510/175 |
| 6,416,590 B1 | * | 7/2002 | Hirata et al. .................. | 148/24 |

FOREIGN PATENT DOCUMENTS

| | | | | |
|---|---|---|---|---|
| DE | 19731151 C | 1/1999 | | |
| EP | 0 379 290 A1 | 7/1990 | | |
| GB | 2376200 A | * 12/2002 | ........... | B23K/35/26 |
| JP | 63 281794 A | 11/1988 | | |
| JP | 2268995 | 11/1990 | | |
| JP | 03152803 A | 6/1991 | | |
| JP | 3152803 | 6/1991 | | |
| JP | 0714493 A | * 11/1993 | ........... | B23K/35/22 |
| JP | 07144293 A | * 11/1993 | | |
| JP | 07132395 A | 5/1995 | | |
| JP | 08174265 A | 7/1996 | | |
| JP | 409038792 A | * 2/1997 | ......... | B23K/35/363 |
| JP | 9327789 | 12/1997 | | |
| JP | 10031912 | 2/1998 | | |
| RU | 2096152 C | 11/1997 | | |
| SU | 1646754 A1 | 7/1991 | | |
| WO | WO 92/05228 | * 4/1992 | ............ | C09K/3/00 |
| WO | WO 9703788 A | 2/1997 | | |

OTHER PUBLICATIONS

Irene W. H. Lee, Screenable Solder Paste, 231 Welding Journal, pp. 32–36, Oct. 1977.
Notification of Transmittal of the International Search Report or the Declaration, dated Aug. 8, 2002.
Notification of Transmittal of the International Search Report or the Declaration, dated Sep. 3, 2002.

* cited by examiner

*Primary Examiner*—Daniel Jenkins
(74) *Attorney, Agent, or Firm*—Senniger Powers

(57) ABSTRACT

A lubricant additive which is a branched chain fatty alcohol or fatty acid containing a total of from 8 to 50 carbon atoms with a minimum of 4 carbon atoms being present in the shorter alkyl chain, or an ester thereof. The lubricant additive is especially adapted for inclusion in a non-aqueous flux vehicle that is mixed with a solder alloy powder to make a solder paste used in the manufacture of printed circuit boards.

14 Claims, 4 Drawing Sheets

TABLE 3

| Example | Additive (%) | Score |
|---|---|---|
| Comparative | None | 2 |
| 1 | Isocarb 24 | 3 |
| 2 | Isocarb 36 | 5 |
| 3 | Isocarb ester 1605 | 4 |
| 4 | Kristol T60 | 4 |
| 5 | Pancera MW | 4 |
| 6 | Iso stearic acid | 4 |
| 7 | Stearic acid | 3 |
| 8 | Palmitic acid | 4 |
| 9 | Micronised PTFE | 3 |
| 10 | 200/100cS | 3 |
| 11 | Dow Corning 704 | 3 |
| 12 | Isofol 24 | 4 |
| 13 | Isocarb 24 (2.5) / Isocarb ester 1605 (2.5) | 4 |
| 14 | Isocarb 24 (4) / Isocarb ester 1605 (1) | 3 |
| 15 | Isocarb 24 (1) | 3 |
| 16 | Isocarb 24 (20) | 4 |
| 17 | Isocarb ester 1605 (1) | 3 |
| 18 | Isocarb ester 1605 (20) | 3 |

FIG. 1

Table 1

| Ex. No. Components | Comp. % | 1 % | 2 % | 3 % | 4 % | 5 % | 6 % | 7 % | 8 % | 9 % | 10 % | 11 % | 12 % | 13 % | 14 % | 15 % | 16 % | 17 % | 18 % |
|---|---|---|---|---|---|---|---|---|---|---|---|---|---|---|---|---|---|---|---|
| Rosin (KE604) [a] | 40 | 35 | 35 | 35 | 35 | 35 | 35 | 35 | 35 | 35 | 35 | 35 | 35 | 35 | 35 | 35 | 35 | 35 | 35 |
| TPNB [b] | 54 | 54 | 54 | 54 | 54 | 54 | 54 | 54 | 54 | 54 | 54 | 54 | 54 | 54 | 54 | 58 | 39 | 58 | 39 |
| Styrene dibromide | 2 | 2 | 2 | 2 | 2 | 2 | 2 | 2 | 2 | 2 | 2 | 2 | 2 | 2 | 2 | 2 | 2 | 2 | 2 |
| Thixatrol + [c] | 4 | 4 | 4 | 4 | 4 | 4 | 4 | 4 | 4 | 4 | 4 | 4 | 4 | 4 | 4 | 4 | 4 | 4 | 4 |
| Isocarb 24 [d] | | 5 | | | | | | | | | | | | 2.5 | 4 | 1 | 20 | | |
| Isocarb 36 [e] | | | 5 | | | | | | | | | | | | | | | | |
| Isocarb ester 1605 [f] | | | | 5 | | | | | | | | | | 2.5 | 1 | | | 1 | |
| Kristol T60 [g] | | | | | 5 | | | | | | | | | | | | | | 20 |
| Paracera MW [h] | | | | | | 5 | | | | | | | | | | | | | |
| Iso stearic acid | | | | | | | 5 | | | | | | | | | | | | |
| Stearic acid | | | | | | | | 5 | | | | | | | | | | | |
| Palmitic acid | | | | | | | | | 5 | | | | | | | | | | |
| Micronised PTPE [i] | | | | | | | | | | 5 | | | | | | | | | |
| 200/100cS [j] | | | | | | | | | | | 5 | 5 | | | | | | | |
| Dow Corning 704 [k] | | | | | | | | | | | | | 5 | | | | | | |
| Isofol 24 [l] | | | | | | | | | | | | | | | | | | | |

[a] Rosin (KE604) available from Arakawa is an acid modified hydrogenated rosin. [b] TPNB available from DOW is tri(propylene glycol) butyl ether. [c] Thixatrol + available from Rheox is a rheological additive. [d] Isocarb 24 available from Condea is 2-decyltetradecanoic acid. [e] Isocarb 36 available from Condea is 2-hexadecyleicosanoic. [f] Isocarb ester 1605 available from Condea is 2-hexyldecanoic acid-pentaerythritol ester. [g] Kristol T60 available from Carless is mineral oil. [h] Panacera MW available from Industrial Waxes Ltd is paraffin wax. [i] Micronised PTPE available from Ranic Ltd is PTFE micropowder. [j] 200/100cS available from Dow Corning is polydimethylsiloxane. [k] Dow Corning 704 available from Dow Corning is Tetramethyltetra-phenyltrisiloxane and pentaphenyltri-methltrisiloxane [l] Isofol 24 available from Condea is 2-decyltetradecanol.

FIG. 3

Table 2

| SCORE | DESCRIPTION | VALUES |
|---|---|---|
| 1 | No paste or almost no paste | $D < \frac{1}{2}A$<br>$H < \frac{2}{3}T$ |
| 2 | More than ½ of pad area covered but insufficient height | $D < \frac{1}{2}A$<br>$H < \frac{2}{3}T$ |
| 3 | More than ⅔ pad area covered, paste reaches same height as stencil | $D < \frac{2}{3}A$<br>$H = T$ for $< \frac{1}{3}A$ |
| 4 | More than ⅔ pad area covered and diameter of top is > ⅓ of aperture | $D < \frac{2}{3}A$<br>$H = T$ for $< \frac{1}{2}A$ |
| 5 | Perfect deposit, same shape as stencil aperture | $D = A$<br>$H = T$ for $> \frac{2}{3}A$ |

FIG. 4

TABLE 3

| Example | Additive (%) | Score |
|---|---|---|
| Comparative | None | 2 |
| 1 | Isocarb 24 | 3 |
| 2 | Isocarb 36 | 5 |
| 3 | Isocarb ester 1605 | 4 |
| 4 | Kristol T60 | 4 |
| 5 | Pancera MW | 4 |
| 6 | Iso stearic acid | 4 |
| 7 | Stearic acid | 3 |
| 8 | Palmitic acid | 4 |
| 9 | Micronised PTFE | 3 |
| 10 | 200/100cS | 3 |
| 11 | Dow Corning 704 | 3 |
| 12 | Isofol 24 | 4 |
| 13 | Isocarb 24 (2.5) / Isocarb ester 1605 (2.5) | 4 |
| 14 | Isocarb 24 (4) / Isocarb ester 1605 (1) | 3 |
| 15 | Isocarb 24 (1) | 3 |
| 16 | Isocarb 24 (20) | 4 |
| 17 | Isocarb ester 1605 (1) | 3 |
| 18 | Isocarb ester 1605 (20) | 3 |

SOLDERING FLUX VEHICLE ADDITIVE AND FINE PITCH PRINTING METHOD

CROSS-REFERENCE TO RELATED APPLICATIONS

Pursuant to 35 U.S.C. § 119, this application claims the benefit of United Kingdom Patent Applications 0113897.3 and 0113898.1, filed Jun. 7, 2001.

BACKGROUND OF THE INVENTION

The present invention relates to a soldering flux vehicle which contains an additive to enhance fine pitch stencil printing, and to solder pastes for use in the electronics industry which are prepared using this flux vehicle and a method of fine pitch stencil printing the same.

There is a trend in the electronics industry towards the automated manufacture of printed circuit boards (PCBs) and towards the miniaturization of electronic devices with the requirement of finer and finer pitch devices. Solder paste is generally printed onto a substrate through a stainless steel or electroformed stencil. Industry standard stencils for PCB manufacture are generally about 0.125 mm or about 0.150 mm in thickness and solder pastes comprising solder powder particles of about 25 to about 45 microns in diameter are required to print about 0.25 mm diameter apertures at about a 0.5 mm pitch.

Solder paste release from a stainless steel or electroformed stencil and subsequent printed pad definition on a PCB is influenced by the chemical nature of the solder paste and, in particular, the soldering flux vehicle. A solder paste has to have a certain amount of "tack" in order that components can be placed in position on the printed solder paste pads accurately and without loss. However, the tackiness of the solder paste which holds a component in position often prevents good printing of the solder paste onto a substrate through a stencil, i.e., good aperture release of the solder paste on printing may be prevented.

Accordingly, a need continues to exist for a solder flux vehicle and solder paste formulation which have an improved release from a stencil during printing, while maintaining the internal tackiness of the solder paste thereby preventing loss of components during the assembly placement of the components onto the PCB.

SUMMARY OF THE INVENTION

Among the objects and features of the present invention, therefore, is the provision of a method of printing a solder paste that improves release from a stencil by including a lubricant additive in the solder paste; the provision of a solder flux vehicle and solder paste which have an improved release from a stencil during printing; the provision of a solder flux vehicle that maintains sufficient internal tackiness of the solder paste thereby preventing loss of components during the assembly placement of the components onto the PCB; and the provision of a solder flux paste for use in fine pitch stencil printing.

Briefly, therefore, the present invention is directed to a method of printing a solder paste onto a substrate surface, the method comprising placing a stencil over the substrate surface, printing the solder paste comprising a lubricant additive through the stencil and removing the stencil from the substrate surface.

The present invention is also directed to a method of printing a solder paste onto a substrate through a stencil wherein the solder paste comprises a lubricant additive to improve the release of the solder paste from the stencil, said lubricant additive comprising a branched chain fatty alcohol or fatty acid comprising 8 to 50 carbon atoms with a minimum of 4 carbon atoms being present in the shorter alkyl chain, or an ester thereof.

The present invention is further directed to a solder paste formulation which comprises a solder powder and a non-aqueous vehicle, wherein the non-aqueous vehicle comprises a lubricant additive which is a branched chain fatty alcohol or fatty acid containing a total of from 8 to 50 carbon atoms with a minimum of 4 carbon atoms being present in the shorter alkyl chain, or an ester thereof.

Other objects will be in part apparent and in part pointed out hereinafter.

BRIEF DESCRIPTION OF THE DRAWING

FIG. 1 is table of solder paste formulations printed for evaluation.

FIG. 3 is a table of criteria for evaluating a fine pitch solder paste deposit.

FIG. 4 is a table of the evaluation results for the tested solder past formulations.

DETAILED DESCRIPTION OF THE INVENTION

Figure 2:
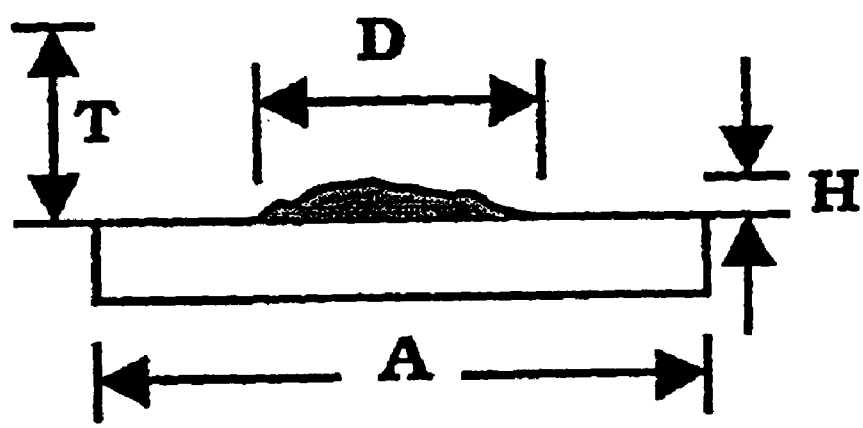
FIG. 2 is a cross-sectional view of a fine pitch solder paste deposit.

In accordance with the present invention, a method of printing a solder paste onto a substrate surface through a stencil has been developed wherein a lubricant additive is included in the solder paste to improve the release of the solder paste from the stencil.

In general, a solder paste is stencil printed onto a substrate surface according to the following steps: (a) placing a stencil over a substrate surface; (b) printing a solder paste comprising a lubricant additive through the stencil; and (c) removing the stencil from the substrate surface. The stencil is preferably a stainless steel or electroformed stencil. Typically, a fine pitch printed circuit board stencil has a thickness of about 0.10 mm to about 0.150 mm, apertures of at least about 0.20 mm, and a pitch of at least about 0.40 mm.

The solder paste of the present invention preferably comprises a non-aqueous vehicle which comprises a lubricant additive. Generally, the lubricant additive is 0.1 to about 2% by weight of the solder paste. The lubricant additive is preferably selected from the group consisting of a fatty acid, a fatty alcohol, a fatty acid ester, a fatty alcohol ester, a mineral oil, a wax, a siloxone, a silicone or a micronised polytetrafluoro-ethylene powder. More preferably, the lubricant additive comprises a branched chain fatty alcohol or fatty acid comprising a total of from 8 to 50 carbon atoms with a minimum of 4 carbon atoms being present in the shorter alkyl chain, or an ester thereof. Still more preferably, the lubricant additive comprises a branched chain fatty alcohol or fatty acid wherein the branch point is at the second carbon position, or ester thereof. These compounds are generally know as Guerbet alcohols or Guerbet acids. Specific examples of preferred Guerbet alcohols and Guerbet acids include 2-butyl-1-octanol, 2-butyl-1-decanol, 2-hexyl-1-octanol, 2-hexyl-1-decanol, 2-hexyl-1-dodecanol, 2-octyl-1-dodecanol, 2-decyl-1-tetradecanol, 2-butyloctanoic acid, 2-butyldecanoic acid, 2-hexyldecanoic acid, 2-hexyldodecanoic acid, 2-octyldodecanoic acid, 2-decyltetradecanoic acid and 2-hexadecyleiconsanoic acid.

In the case where the lubricant additive is an ester of a branched fatty alcohol, the lubricant additive may also comprise a fatty acid, dibasic acid or tribasic acid. Examples include stearates, oleates, palmitates, isostearates, adipates, trimellitates, thiodipropionates and pentaerythritol esters.

The solder paste of the present invention generally comprises about 75% to about 95% by weight of solder powder, preferably about 85% to about 90% by weight of the solder powder. The solder powder generally has an average particle size in the range of about 10 to about 80 micrometers, preferably about 25 to about 45 micrometers. The solder powder may be any suitable solder alloy composition. Exemplary solder alloys include SnPb alloys (such as Sn37Pb63), SnPbBi alloys, SnBi alloys, SnPbAg alloys, SnAgCu alloys, SnAgCuBi alloys and SnZnBi alloys.

The non-aqueous vehicle used in the solder paste compositions of the present invention generally comprise at least one polar organic solvent such as a polyhydric alcohol including ethylene glycol, diethylene glycol, propylene glycol, sorbitol, pentaerythritol and derivatives thereof, butyl diglyme, dibutyl itaconate, di(propylene glycol) butyl ether, 2-ethyl hexyl diglycol, γ-butyrolactone, hexyl carbitol, N-methyl pyrrolidone, N-ethyl pyrrolidone, terpineol or tetraglyme. Tri (propylene glycol) butyl ether is particularly preferred.

The non-aqueous vehicle may contain one or more thickeners which enable the rheological characteristics of the vehicle to be modified, as desired. Exemplary thickeners include polyacrylic acid, hydrogenated castor oil and derivatives thereof, polyamides or resins. If included, thickeners may comprise up to about 30% by weight of the vehicle.

If desired additional components may be added to the solder paste to modify properties, for instance, and activator may be included to enhance fluxing activity for solder reflow. Typical fluxing additives which are known to those skilled in the art may be used. Activators may be included in the solder paste compositions typically in amounts up to about 7% by weight of the vehicle. Other additives may include tackifiers, antioxidants and surfactants—these additives typically comprise less than about 5% by weight of the vehicle.

The following non-limiting Examples illustrate the present invention.

EXAMPLES

A number of flux gels were produced from the following components given in Table 1 of FIG. 1 and then mixed with a solder powder (Sn62Pb36Ag2 particles of about 25 to about 45 micrometers in diameter) to give a solder paste containing about 10% flux gel and about 90% solder powder.

The solder pastes were each printed through a series of about 250 micrometer apertures using an electroformed stencil about 0.125 mm thick and an MPM AP27 printer. The 1st, 5th, and 10th prints were visually examined and compared with a visual standard depicted in FIG. 2 wherein T represents the stencil thickness, A the aperture diameter, D the paste diameter and H the paste height. The visual inspection entailed assigning a score in accordance with the standards set forth in Table 2 of FIG. 3. In addition, the appearance of the first print was recorded at 90 and 45 degrees using the SPIDA (Solder Paste Inspection Data Analyzer).

The results of the visual inspection are provided in Table 3 of FIG. 4. It can be seen from the results in Table 3 that the solder pastes made with flux gels containing the lubricant additions showed improved print definition when compared with a paste made with a flux gel containing no lubricant addition.

In light of the detailed description of the invention and the examples presented above, it can be appreciated that the several objects of the invention are achieved.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the invention.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

What is claimed is:

1. A method of printing a solder paste onto a substrate surface, the method comprising:
   (a) placing a stencil over the substrate surface;
   (b) printing the solder paste through the stencil, wherein the solder paste comprises a lubricant additive comprising a branched chain fatty acid comprising 8 to 50 carbon atoms with a minimum of 4 carbon atoms being present in the shorter alkyl chain, or ester thereof, wherein the branched chain fatty acid has a branch point at a second carbon position; and
   (c) removing the stencil from the substrate surface.

2. A method of printing a solder paste onto a substrate surface, the method comprising:
   (a) placing a stencil over the substrate surface;
   (b) printing the solder paste through the stencil, wherein the solder paste comprises a branched chain fatty alcohol or fatty acid lubricant additive comprising 8 to 50 carbon atoms with a minimum of 4 carbon atoms being present in the shorter alkyl chain, or ester thereof;
   wherein the lubricant additive is selected from the group consisting of 2-butyl-1-octanol, 2-butyl-1-decanol, 2-hexyl-1-octanol, 2-hexyl-1-decanol, 2-hexyl-1-dodecanol, 2-octyl-1-dodecanol, 2-decyl-1-tetradecanol, 2-butyloctanoic acid, 2-butyldecanoic acid, 2-hexyldecanoic acid, 2-hexyldodecanoic acid, 2-octyldodecanoic acid, 2-decyltetradecanoic acid and 2-hexadecyleicosanoic acid; and
   (c) removing the stencil from the substrate surface.

3. The method as set forth in claim 1 wherein the solder paste comprises about 75% to about 95% by weight of a solder powder.

4. The method as set forth in claim 1 wherein the solder powder comprises about 85% to about 90% by weight of a solder paste.

5. The method as set forth in claim 3 wherein the solder powder is an alloy composition selected from the group consisting of SnPb alloys, SnPbBi alloys, SnBi alloys, SnPbAg alloys, SnAgCu alloys, SnAgCuBi alloys and SnZnBi alloys.

6. The method as set forth in claim 1 wherein the solder paste comprises about 0.1 to about 2% by weight of the lubricant additive.

7. The method as set forth in claim 1 wherein the solder paste comprises a polar organic solvent that is a polyhydric alcohol selected from the group consisting of ethylene glycol, diethylene glycol, propylene glycol, sorbitol, pentaerythritol and derivatives thereof, tri(propylene glycol) butyl ether, butyl diglyme, dibutyl itaconate, di(propylene glycol) butyl ether, 2-ethyl hexyl diglycol, γ-butyrolactone, hexyl carbitol, N-methyl pyrrolidone, N-ethyl pyrrolidone, terpineol and tetraglyme.

8. A solder paste comprising a solder powder and a non-aqueous vehicle, wherein the non-aqueous vehicle comprises a lubricant additive which is a branched chain fatty acid comprising 8 to 50 carbon atoms with a minimum of 4 carbon atoms being present in the shorter alkyl chain, or an ester thereof, wherein the branched chain fatty acid has a branch point at a second carbon position.

9. A solder paste comprising a solder powder and a non-aqueous vehicle, wherein the non-aqueous vehicle comprises a lubricant additive which is a branched chain fatty alcohol or fatty acid comprising 8 to 50 carbon atoms with a minimum of 4 carbon atoms being present in the shorter alkyl chain, or an ester thereof, wherein the lubricant additive is selected from the group consisting of 2-butyl-1-octanol, 2-butyl-1-decanol, 2-hexyl-1-octanol, 2-hexyl-1-decanol, 2-hexyl-1-dodecanol, 2-octyl-1-dodecanol, 2-decyl-1-tetradecanol, 2-butyloctanoic acid, 2-butyldecanoic acid, 2-hexyldecanoic acid, 2-hexyldodecanoic acid, 2-octyldodecanoic acid, 2-decyltetradecanoic acid and 2-hexadecyleicosanoic acid.

10. The solder paste as set forth in claim 8 wherein the solder powder comprises about 75% to about 95% by weight of a solder paste.

11. The solder paste as set forth in claim 8 wherein the solder powder comprises about 85% to about 90% by weight of a solder paste.

12. The solder paste as set forth in claim 8 wherein the solder powder is an alloy composition selected from the group consisting of SnPb alloys, SnPbBi alloys, SnBi alloys, SnPbAg alloys, SnAgCu alloys, SnAgCuBi alloys and SnZnBi alloys.

13. The solder paste as set forth in claim 8 wherein the lubricant additive comprises about 0.1 to about 2% by weight of the solder paste.

14. The solder paste as set forth in claim 8 wherein the non-aqueous vehicle comprises a polar organic solvent that is polyhydric alcohol selected from the group consisting of ethylene glycol, diethylene glycol, propylene glycol, sorbitol, pentaerythritol and derivatives thereof, tri(propylene glycol) butyl ether, butyl diglyme, dibutyl itaconate, di(propylene glycol) butyl ether, 2-ethyl hexyl diglycol, γ-butyrolactone, hexyl carbitol, N-methyl pyrrolidone, N-ethyl pyrrolidone, terpineol and tetraglyme.

* * * * *